United States Patent
Kirchner et al.

(10) Patent No.: US 11,258,288 B2
(45) Date of Patent: Feb. 22, 2022

(54) CIRCUIT FOR INDUCING MULTI-DIRECTIONAL CURRENT IN A BATTERY

(71) Applicant: Infineon Technologies Austria AG, Villach (AT)

(72) Inventors: Uwe Kirchner, St. Michael i. Lav. (AT); Leo Aichriedler, Puch (AT); Stefano De Filippis, Villach (AT)

(73) Assignee: Infineon Technologies Austria AG, Villach (AT)

( * ) Notice: Subject to any disclaimer, the term of this patent is extended or adjusted under 35 U.S.C. 154(b) by 445 days.

(21) Appl. No.: 16/272,802

(22) Filed: Feb. 11, 2019

(65) Prior Publication Data
US 2020/0259353 A1    Aug. 13, 2020

(51) Int. Cl.
*H02J 7/00*   (2006.01)
*H02J 7/34*   (2006.01)
*H03K 17/567* (2006.01)

(52) U.S. Cl.
CPC .......... *H02J 7/0091* (2013.01); *H02J 7/0021* (2013.01); *H02J 7/0024* (2013.01); *H02J 7/0068* (2013.01); *H02J 7/00309* (2020.01); *H02J 7/007192* (2020.01); *H02J 7/345* (2013.01); *H03K 17/567* (2013.01)

(58) Field of Classification Search
CPC ...... H02J 7/0091; H02J 7/0021; H02J 7/0024; H02J 7/0068; H02J 7/345; H02J 7/0071; H02J 7/1423; H02J 7/0031; H02J 7/342; H03K 17/567
USPC .................. 320/103, 126, 136, 150
See application file for complete search history.

(56) References Cited

U.S. PATENT DOCUMENTS

| | | | |
|---|---|---|---|
| 6,008,630 A | 12/1999 | Prasad | |
| 6,340,879 B1 | 1/2002 | Blaecker | |
| 9,816,475 B1* | 11/2017 | Buchanan | F02N 11/0866 |
| 2011/0144861 A1* | 6/2011 | Lakirovich | B60L 50/64 |
| | | | 701/36 |
| 2012/0313572 A1* | 12/2012 | Sheu | H02J 7/0072 |
| | | | 320/107 |
| 2013/0141032 A1 | 6/2013 | Xu et al. | |

(Continued)

OTHER PUBLICATIONS

U.S. Appl. No. 16/011,148, filed Jun. 18, 2018, naming inventors Kirchner et al.

(Continued)

*Primary Examiner* — Richard Isla
*Assistant Examiner* — Mohammed J Sharief
(74) *Attorney, Agent, or Firm* — Shumaker & Sieffert, P.A.

(57) ABSTRACT

In general, this disclosure includes systems, methods, and techniques for inducing electrical current through one or more battery banks. For example, a circuit may include a switching element. The circuit may be configured to draw, using the switching element, a current from a first battery bank when the switching element is turned on, the first battery bank emitting an excess current after the switching element is turned off, where the current increases a temperature of the first battery bank. Additionally, the circuit may be configured to deliver at least some of the excess current to a second battery bank when the switching element is turned off, where the excess current charges the second battery bank, and where the excess current increases a temperature of the second battery bank.

15 Claims, 5 Drawing Sheets

(56) References Cited

U.S. PATENT DOCUMENTS

| 2014/0285135 | A1* | 9/2014 | Ji | H02J 7/00711 |
| | | | | 320/103 |
| 2017/0256974 | A1* | 9/2017 | Baker | H02J 7/0068 |
| 2017/0331303 | A1* | 11/2017 | Ha | H02J 7/0031 |
| 2020/0395640 | A1* | 12/2020 | Sun | G01R 31/3842 |

OTHER PUBLICATIONS

Examination Report from counterpart European Application No. 20156355.8, dated Apr. 2, 2020, 9 pp.

* cited by examiner

CIRCUIT FOR INDUCING MULTI-DIRECTIONAL CURRENT IN A BATTERY

TECHNICAL FIELD

This disclosure relates to circuit electronics including switching elements.

BACKGROUND

Switching elements may regulate the flow of current in a circuit. For instance, a switching element may conduct electricity while the switching element is 'on,' and the switching element may prevent current from passing while the switching element is 'off.' A circuit may include switching elements and other electrical circuit components for determining a current magnitude and a direction of current flow within the circuit. In some cases, a circuit including switching elements may induce and control an electrical current through at least part of a battery.

SUMMARY

In general, this disclosure is directed to techniques for a circuit including switching elements which may induce electrical current through a battery. The battery may be divided, in some cases, into a first battery bank and a second battery bank. In some examples, the first battery bank and the second battery bank are connected in parallel, and the circuit is electrically coupled to each of the first battery bank and the second battery bank. The circuit may transfer energy (e.g., electrical current) between the battery banks such that electrical current passes through an internal resistance of the first battery bank and an internal resistance of the second battery bank, causing a temperature of the battery banks to increase.

Although, in some examples, the circuit exclusively transfers energy from the first battery bank to the second battery bank, in other examples, the circuit may be configured for multi-directional energy transfer. For instance, the circuit may be configured to alternate between a first switching mode and a second switching mode using switching elements. During the first switching mode, the circuit may transfer energy from the first battery bank to the second battery bank and during the second switching mode, the circuit may transfer energy from the second battery bank to the first battery bank.

The techniques of this disclosure may have one or more technical advantages. For example, it may be difficult or undesirable to deliver power from a battery to a load after the battery is stored in an exceptionally cold environment (e.g., below 0° Celsius). One or more techniques of this disclosure include inducing a current in the battery such that the current crosses an internal resistance of the battery, causing a temperature of the battery to increase. After the temperature of the battery is increased to a temperature threshold value, a probability that the battery will be adversely affected by powering the load may decrease. Additionally, in cases where the battery includes a first battery bank and a second battery bank, it may be beneficial to transfer energy from the first battery bank to the second battery bank. Such an energy transfer may increase the temperature of the battery and improve an energy efficiency of the battery, since the energy drawn from the first battery bank may heat up both of the first battery bank and the second battery bank while charging the second battery bank.

In some examples, a circuit includes a switching element. The circuit is configured to draw, using the switching element, a current from a first battery bank when the switching element is turned on, the first battery bank emitting an excess current after the switching element is turned off, where the current increases a temperature of the first battery bank. The circuit is further configured to deliver at least some of the excess current to a second battery bank when the switching element is turned off, where the excess current charges the second battery bank, and where the excess current increases a temperature of the second battery bank.

In other examples, a system includes a first battery bank including a first positive terminal and a first negative terminal, a second battery bank including a second positive terminal and a second negative terminal, where the second battery bank is connected in parallel with the first battery bank, and a circuit. The circuit includes a switching element including a source terminal and a drain terminal, where the switching element is connected in parallel with the first battery bank and the second battery bank, where the source terminal is electrically connected to the first negative terminal and the drain terminal is electrically connected to the first positive terminal, and where while the switching element is turned on, the first positive terminal and the first negative terminal are electrically connected via the switching element.

In other examples, a method includes drawing, using a switching element of a circuit, a current from a first battery bank when the switching element is turned on, where the current increases a temperature of the first battery bank. The method further includes delivering, using the circuit, at least some of an excess current to a second battery bank when the switching element is turned off, where the excess current is emitted by the first battery bank, where the excess current charges the second battery bank, and where the excess current increases a temperature of the second battery bank.

The summary is intended to provide an overview of the subject matter described in this disclosure. It is not intended to provide an exclusive or exhaustive explanation of the systems, devices, and methods described in detail within the accompanying drawings and description below. Further details of one or more examples of this disclosure are set forth in the accompanying drawings and in the description below. Other features, objects, and advantages will be apparent from the description and drawings, and from the claims.

DETAILED DESCRIPTION

Figure 1:
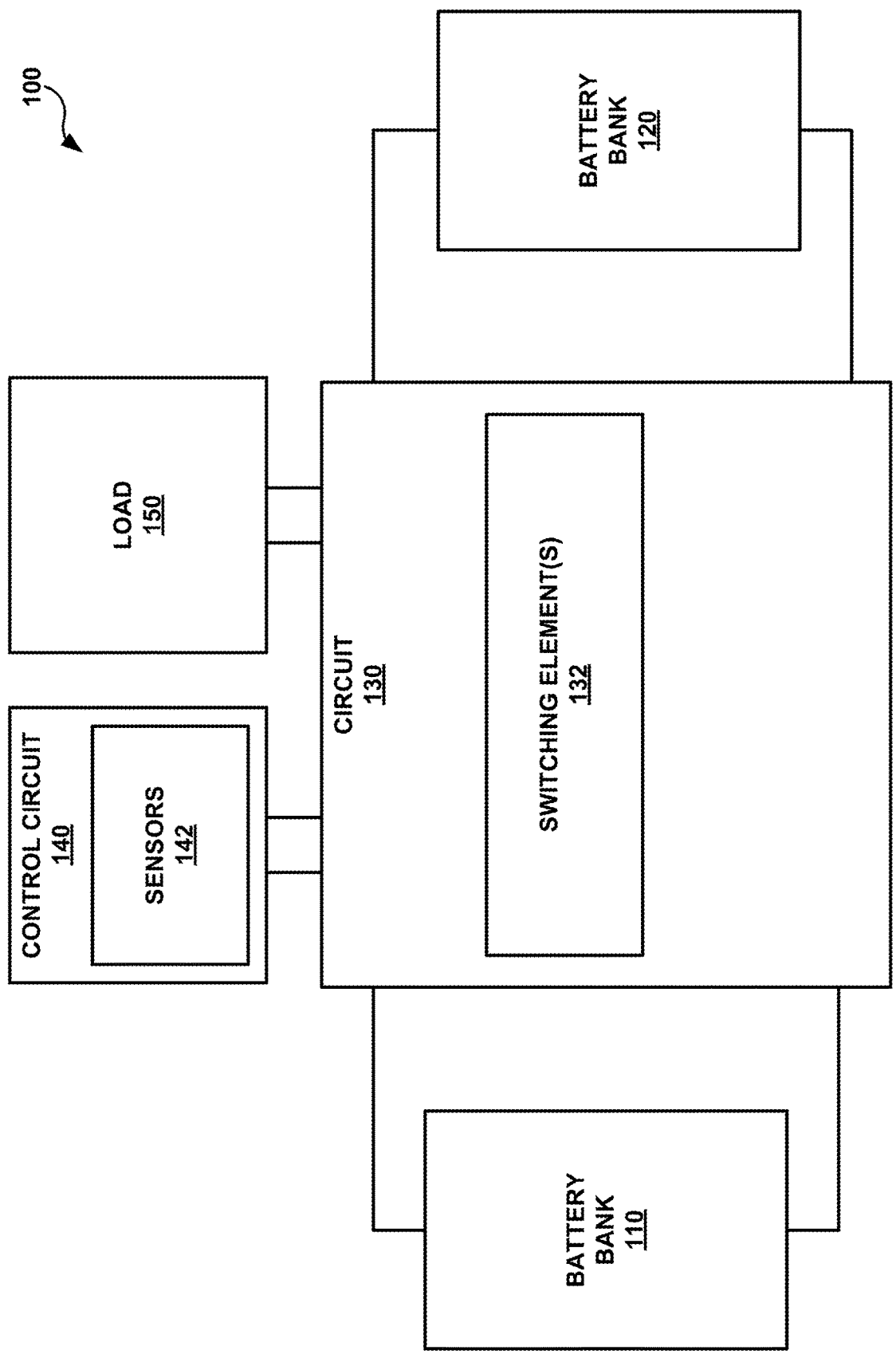
FIG. 1 is a block diagram illustrating an exemplary system for heating up a first battery bank and a second battery bank, in accordance with one or more techniques of this disclosure.

In general, techniques of this disclosure may enable a circuit to perform one or more battery heat-up procedures, increasing a temperature of a battery above a temperature threshold value before the battery is used to power a load. The circuit may include at least one switching element configured to activate ("turn on") and deactivate ("turn off") during the operation of the circuit. Using the at least one switching element, the circuit may be configured to draw electric current from a battery. The battery, which may function as a power source, may exhibit properties of various circuit components. For example, the battery may be composed of a physical structure, and the physical structure may act as a resistor. When electric current crosses the physical structure of the battery, resistive properties of the physical structure may cause the battery to release heat, increasing the temperature of the battery. These resistive properties may be referred to herein as "internal resistance." In fact, every conductive material is defined by an internal resistance. Due to internal resistance, as electric current passes through a conductive material, energy is released as heat. This phenomenon is known as the Joule effect.

It may be beneficial, during the one or more battery heat-up procedures, for electric current to flow across the battery, thus causing the temperature of the battery to increase. Additionally, it may be beneficial to conserve a charge level of the battery during the one or more battery heat-up procedures. For example, the battery may include two or more battery banks connected in parallel. Each battery bank may include a plurality of cells connected in series, the plurality of cells defining a power source capable of outputting electric current. Each of the battery banks may define an internal resistance. As such, each of the battery banks may be heated according to the Joule effect. In some examples, a circuit of this disclosure is electrically connected to a first battery bank and a second battery bank, the circuit inducing electric current in the first battery bank and delivering electric current to the second battery bank. The circuit may cause current to flow across both of the battery banks and conserve power by transferring energy from the first battery bank to the second battery bank. In some examples described herein, while the circuit transfers energy from the first battery bank to the second battery bank, the circuit may increase the temperature of the first battery bank faster than the circuit increases the temperature of the second battery bank.

In order to balance a temperature of the first battery bank with a temperature of the second battery bank, a circuit of this disclosure may be configured to operate in a first switching mode and a second switching mode. The circuit may activate and deactivate a plurality of switching elements to alternate between the first switching mode and the second switching mode. During the first switching mode, the circuit may transfer energy form the first battery bank to the second battery bank and increase the temperature of the first battery bank faster than the temperature of the second battery bank. During the second switching mode, the circuit may transfer energy from the second battery bank to the first battery bank and increase the temperature of the second battery bank faster than the temperature of the first battery bank.

A circuit of this disclosure may be configured to connect and disconnect the first battery bank and the second battery bank from a load. For example, the circuit may include a first load-connecting switching element and a second load-connecting switching element. If the first load-connecting switching element is activated, the circuit may deliver electric current from the first battery bank to the load. Additionally, if the second load-connecting switching element is activated, the circuit may deliver electric current from the second battery bank to the load. Deactivating the first load-connecting switching element disconnects the first battery bank from the load. Deactivating the second load-connecting switching element disconnects the second battery bank from the load.

FIG. 1 is a block diagram illustrating an exemplary system 100 for heating up a first battery bank 110 and a second battery bank 120, in accordance with one or more techniques of this disclosure. As illustrated in the example of FIG. 1, system 100 includes first battery bank 110, second battery bank 120, circuit 130, switching element(s) 132, control circuit 140, sensors 142, and load 150.

A battery may include first battery bank 110 and second battery bank 120 (collectively, "battery banks 110, 120"), where battery banks 110, 120 are configured to provide power to a load 150. In addition to providing power to load 150, battery banks 110, 120 may provide power to circuit 130 and control circuit 140. In some examples, the battery exclusively includes battery banks 110, 120. Alternatively, in some examples, the battery may include yet additional battery banks (not illustrated in FIG. 1) in addition to battery banks 110, 120. First battery bank 110 and second battery bank 120 are connected in parallel. As such, both of battery banks 110, 120 are configured to provide power to load 150. Battery banks 110, 120, for example, may each include a plurality of cells arranged in series. In some examples, the plurality of cells includes a plurality of lithium-ion cells. In other examples, the plurality of cells includes lead-acid cells, nickel metal hydride cells, or other materials. In some examples, a maximum voltage output of first battery bank 110 is approximately 400V and a maximum voltage output of second battery bank 120 is approximately 400 V. Since first battery bank 110 and second battery bank 120 are connected in parallel, a collective maximum voltage output of battery banks 110, 120 is approximately 400V. However, in other examples, the maximum voltage output of respective battery banks 110, 120 may be another value or range of values.

Battery banks 110, 120 may each include a positive terminal and a negative terminal. A direction in which current flows between the positive terminal and the negative terminal may determine whether battery banks 110, 120 are recharged or drained. For example, if a current is emitted from the positive terminal of first battery bank 110 (e.g., current flows through first battery bank 110 from the negative terminal to the positive terminal), first battery bank 110 may be drained of power. Alternatively, if current is received at the positive terminal of first battery bank 110 (e.g., current flows through first battery bank 110 from the positive terminal to the negative terminal), first battery bank 110 may be recharged.

Each of battery banks 110, 120 include an internal resistance (not illustrated in FIG. 1) and an internal inductance (not illustrated in FIG. 1). Even though a battery may not be considered a "resistor," or a "inductor," a battery may exhibit resistance and inductance properties when the battery is used in a circuit. A battery may include a physical structure. When electrical current crosses the physical structure of the battery, properties of the physical structure may give rise to the internal resistance and the internal inductance of the battery. For example, when electrical current crosses first battery bank 110, a physical structure of first battery bank 110 may resist the flow of the electrical current through first battery bank 110, thus representing the internal resistance of first battery bank 110. By the same token, the physical structure of first battery bank 110 may resist changes in a magnitude of the electrical current flowing through first battery bank 110, representing the internal inductance of first battery bank 110. Each of battery banks 110, 120, is inseparable from its respective internal resistance and internal inductance, and the internal resistances of battery banks 110, 120 may influence the operation of circuit 130 when battery banks 110, 120 are electrically coupled to circuit 130. As current crosses the internal resistances of battery banks 110, 120 (e.g., current crosses the respective physical structures of battery banks 110, 120), the internal resistances release energy in the form of heat.

Circuit 130 may include electrical circuit elements, including any combination of capacitors, resistors, inductors, semiconductors, and transistors. In some examples, circuit 130, controlled in the example of FIG. 1 by control circuit 140, determines the flow of electrical current through battery banks 110, 120. Placed in parallel between battery banks 110, 120, circuit 130 is configured to determine interactions between first battery bank 110 and second battery bank 120, and circuit 130 is additionally configured to determine an amount of power that is delivered to load 150 from battery banks 110, 120. In some examples, control circuit 140 controls circuit 130 to perform a battery warm-up procedure. The battery warm-up procedure may increase a temperature of first battery bank 110 and increase a temperature of second battery bank 120 while battery banks 110, 120 are not being used to power load 150. Additionally, or alternatively, circuit 130 may act as a gateway between battery banks 110, 120 and load 150. For example, circuit 130 may be configured to enable any combination of battery banks 110, 120 to power load 150, and circuit 130 may be configured to disconnect any combination of battery banks 110, 120 from load 150. Some example techniques of this disclosure may use switching elements of circuit 130, such as switching element(s) 132, to perform the battery warm-up procedure and connect or disconnect battery banks 110, 120 from load 150.

Switching element(s) 132 may, in some cases, include power switches such as, but not limited to, any type of field-effect transistor (FET) including any combination of metal-oxide-semiconductor field-effect transistors (MOSFETs), bipolar junction transistors (BJTs), insulated-gate bipolar transistors (IGBTs), junction field effect transistors (JFETs), high electron mobility transistors (HEMTs), or other elements that use voltage for control. Additionally, switching element(s) 132 may include n-type transistors, p-type transistors, and power transistors, or any combination thereof. In some examples, switching element(s) 132 include vertical transistors, lateral transistors, and/or horizontal transistors. In some examples, switching element(s) 132 include other analog devices such as diodes and/or thyristors. In some examples, switching element(s) 132 may operate as switches and/or as analog devices. Switching element(s) 132 may include a single switching element 132 configured to be controlled by control circuit 140. Alternatively, switching element(s) 132 may include a plurality of switching elements 132, where each switching element of the plurality of switching elements 132 may be independently controlled by control circuit 140.

In some examples where switching element(s) 132 include a single switching element 132, switching element 132 includes three terminals: two load terminals and a control terminal. For MOSFET switches, switching element 132 may include a drain terminal, a source terminal, and at least one gate terminal, where the control terminal is a gate terminal. For BJT switches, the control terminal may be a base terminal. Current may flow between the two load terminals of switching element 132, based on the voltage at the control terminal. Therefore, electrical current may flow across switching element 132 based on control signals delivered to the control terminal of switching element 132 by control circuit 140. In one example, a voltage magnitude of 10V must be applied to the control terminal of switching element 132 in order to turn switching element 132 'on,' allowing switching element 132 to draw a current from first battery bank 110 and conduct electricity. In other examples, other voltage magnitudes may be required to activate switching element 132. Furthermore, switching element 132 may be turned 'off' when the voltage applied to the control terminal of switching element 132 is decreased.

Additionally, in some examples where switching element(s) 132 include a plurality of switching elements 132, control circuit 140 is configured to independently control each switching element of switching elements 132.

Switching element(s) 132 may include various material compounds, such as Silicon, Silicon Carbide, Gallium Nitride, or any other combination of one or more semiconductor materials. In some examples, silicon carbide switches may experience lower power losses. Fast switching devices may allow switching element(s) 132 to draw short bursts of current from battery banks 110, 120. In some examples, switching devices may include Gallium Nitride switches which may have faster switching speeds than other switches, such as silicon switches or silicon carbide switches. These higher frequency switching elements may require control signals (e.g., voltage signals delivered from control circuit 140 to control terminals of switching element(s) 132) to be sent with more precise timing, as compared to lower-frequency switching elements.

In some examples where switching element(s) 132 include a single switching element 132 and circuit 130 is performing the battery warm-up procedure, circuit 130 may be configured to draw, using the switching element 132, a current from first battery bank 110 when switching element 132 is turned on. Put another way, when switching element 132 is turned on, switching element 132 creates a short circuit including first battery bank 110, causing the current to flow through first battery bank 110 and switching element 132. The current may increase a temperature of first battery bank 110. First battery bank 110 emits an excess current after switching element 132 is turned off. In some examples, the excess current is emitted by an internal inductance of first battery bank 110, the internal inductance resisting a change in electrical current magnitude through first battery bank 110. Circuit 130 may deliver at least some of the excess current to second battery bank 120 when switching element 132 is turned off, where the excess current charges second battery bank 120, and where the excess current increases a temperature second battery bank 120. Circuit 130 may additionally include a capacitor. In some examples, the capacitor is placed in parallel with the switching element 132. Circuit 130 may be configured to charge, using the excess current emitted by first battery bank 110, the capacitor while the switching element 132 is turned off. Circuit 130 is configured to discharge the capacitor when the switching element 132 is turned on, the capacitor emitting a second current to second battery bank 120. The second current may charge second battery bank 120, and the second current may increase a temperature of the second battery bank 120.

In such examples where switching element(s) 132 include the single switching element, circuit 130 may be configured to transfer energy from first battery bank 110 to second battery bank 120, yet circuit 130 may not be configured to transfer energy from second battery bank 120 to first battery bank 110. Consequently, over a period of time in which the battery warm-up procedure commences, first battery bank 110 may lose charge and second battery bank 120 may gain charge. Additionally, over the period of time, the temperature of first battery bank 110 may increase at a faster rate than the temperature of second battery bank 120 since a magnitude of the current induced in first battery bank 110 while the switching element 132 is turned on is greater than a magnitude of the excess current delivered to second battery bank 120 while the switching element 132 is turned off. To correct for this asymmetry in charge and temperature between battery banks 110, 120 during the battery warm-up procedure, it may be beneficial, in some cases, to include a plurality of switching element(s) 132 in circuit 130.

In some examples where switching element(s) 132 include the plurality of switching elements 132, control circuit 140 may be configured to control the plurality of switching elements 132 to alternate between a first switching mode and a second switching mode. In this way, control circuit 140 is configured to control the plurality of switching elements 132 to change a direction in which energy is transferred between battery banks 110, 120. For example, during the first switching mode, a first switching element 132 may induce a current in first battery bank 110 while the first switching element 132 is turned on. Additionally, circuit 130 may deliver an excess current to second battery bank 120 while the first switching element 132 is turned off. While circuit 130 is operating in the second switching mode, a second switching element 132 may induce a current in second battery bank 120. Circuit 130 is configured to deliver an excess current to first battery bank 110 while the second switching element is turned off.

During the first switching mode, a charge of first battery bank 110 may decrease and a charge of second battery bank 120 may increase. Additionally, the temperature of first battery bank 110 may increase at a greater rate than the temperature of second battery bank 120. Alternatively, during the second switching mode, the charge of first battery bank 110 may increase and the charge of second battery bank 120 may decrease. Additionally, the temperature of second battery bank 120 may increase at a greater rate than the than the temperature of first battery bank 110. In some examples, it may be beneficial to alternate circuit 130 between the first switching mode and the second switching mode in order to balance the charge level and the temperature of battery banks 110, 120 during the battery warm-up procedure.

In some examples, circuit 130 is configured to operate in the first switching mode during a plurality of primary phases, where each primary phase of the plurality of primary phases lasts for a first amount of time. Additionally, circuit 130 is configured to operate in the second switching mode during a plurality of secondary phases, where each secondary phase of the plurality of secondary phases lasts for a second amount of time. Circuit 130 may be configured to interleave the plurality of primary phases and the plurality of secondary phases such that a primary phase is followed by a secondary phase, and the secondary phase is followed by a consecutive primary phase. In this way, circuit 130 may balance the temperature and the charge level of battery banks 110, 120. Control circuit 140 may include any one or more of a microprocessor, a controller, a digital signal processor (DSP), an application specific integrated circuit (ASIC), a field-programmable gate array (FPGA), discrete logic circuitry, or any other processing circuitry configured to provide the functions attributed to control circuit 140 herein. Control circuit 140 may be embodied as firmware, hardware, software or any combination thereof. In some examples, any combination of first battery bank 110 and second battery bank 120 provide power to control circuit 140. Additionally, or alternatively, control circuit 140 may be powered by an auxiliary battery, or another energy source. In some examples, control circuit 140 is configured to deliver control signals to switching element(s) 132, controlling the flow of electricity across switching element(s) 132. Control circuit 140 may regulate an amount of time that switching element(s) 132 are turned on and regulate an amount of time that switching element(s) 132 are turned off.

In order to regulate the amount of time that switching element(s) 132 are turned on, control circuit 140 may deliver control signals to the control terminals of switching element(s) 132, accurately determining the amount of time that switching element(s) 132 are turned on. In some examples, at least some of switching element(s) 132 are "fast" switching devices which require precise control signals from control circuit 140 for operation. Additionally, in some examples, at least some of switching element(s) 132 may be "slow" switching devices. Control signals for operating slow switching devices are not as precise as control signals for operating fast switching devices.

Control circuit 140 includes sensors 142. Sensors 142 may include temperature sensors, voltage sensors, current sensors, light sensors, accelerometers, or any combination thereof. In some examples, it may be beneficial to use sensors 142 to determine when to alternate circuit 130 between the first switching mode and the second switching mode. In some examples, sensors 142 include a first temperature sensor configured to measure the temperature of first battery bank 110 and a second temperature sensor configured to measure the temperature of second battery bank 120. Control circuit 140 is configured to change circuit 130 from operating in the first switching mode to operating in the second switching mode if the temperature of first battery bank 110 is greater than the temperature of second battery bank 120 by more than a temperature difference threshold. Additionally, control circuit 140 is configured to change circuit 130 from operating in the second switching mode to operating in the first switching mode if the temperature of second battery bank 120 is greater than the temperature of first battery bank 110 by more than the temperature difference threshold. In some examples, the temperature difference threshold is within a range between 1° Celsius and 5° Celsius. However, in other examples, other temperature difference thresholds may be used. The temperature difference threshold may be any temperature value or range of temperature values.

In some examples, sensors 142 include a first voltage sensor configured to measure a magnitude of a voltage of first battery bank 110 and a second voltage sensor configured to measure a magnitude of a voltage of second battery bank 120. Control circuit 140 is configured to change circuit 130 from operating in the first switching mode to operating in the second switching mode if the magnitude of the voltage of first battery bank 110 is less than the magnitude of the voltage of second battery bank 120 by more than a voltage difference threshold. Additionally, control circuit 140 is configured to change circuit 130 from operating in the second switching mode to operating in the first switching mode if the magnitude of the voltage of second battery bank 120 is less than the magnitude of the voltage of first battery bank 110 by more than the voltage difference threshold. In some examples, the voltage difference threshold is within a range between 1 Volt and 5 Volts. However, in other examples, other voltages may define the voltage different threshold. The voltage difference threshold may be any voltage value or range of voltage values.

In some examples, control circuit 140 may initiate the battery warm-up procedure based on sensors 142. For example, if sensors 142 detect that the temperature of battery banks 110, 120 is below the temperature threshold value, control circuit 140 may control circuit 130 to initiate the battery warm-up procedure. Alternatively, if sensors 142 detect that the temperature of battery banks 110, 120 is above the temperature threshold value, control circuit 140 may connect battery banks 110, 120 to load 150 without initiating the battery warm-up procedure. In some examples, the temperature threshold value is zero degrees Celsius.

Load 150 may define a collection of electrical components that consume power. In some examples, load 150 may include brushless direct current (BLDC) electric motors, brushed direct current (DC) motors, alternating current (AC) induction motors, or other types of electric motors. Additionally, in some examples, load 150 includes a collection of circuit components such as resistors, inductors, capacitors, diodes, and other semiconductor elements. In some examples, load 150 includes electric motors and other electric components (e.g., dashboard, control panels, heating/ cooling systems, and lights) of a battery electric vehicle (BEV) or a hybrid electric vehicle (HEV). Example BEVs and HEVs include cars, trucks, buses, motorcycles, golf carts, all-terrain vehicles (ATVs), snowmobiles, aircraft, and watercraft. In other examples, load 150 includes electric motors and electric components used in other applications.

In some examples, load 150 requires a large current from first battery bank 110 and second battery bank 120. For example, the maximum current required by load 150 may be greater than approximately 1000 Amperes. The maximum current required by load 150 may adversely affect a long-term quality of the battery banks 110, 120 if the maximum current is drawn from battery banks 110, 120 while the temperature of battery banks 110, 120 is below the temperature threshold value. Although the battery warm-up procedures described herein include drawing electric current from battery banks 110, 120, a maximum current magnitude drawn from battery banks 110, 120 by load 150 is greater, in some examples, than a maximum current magnitude drawn from battery banks 110, 120 by switching unit(s) 132. As such, performing a battery warm-up procedure to increase the temperature of battery banks 110, 120 may be preferable to powering load 150 while the battery temperature is below the temperature threshold value.

Circuit 130 may, in some cases, determine a combination of battery banks 110, 120 that are connected to load 150 and a combination of battery banks 110, 120 that are disconnected from load 150. In some examples, switching element(s) 132 include a first load connection switch and a second load connection switch. Circuit 130 may connect load 150 to battery banks 110, 120 when the first load connection switch and the second load connection switch are turned on. Additionally, Circuit 130 may disconnect load 150 from first battery bank 110 while the first load connection switch is turned off and disconnect load 150 from second battery bank 120 while the second load connection switch is turned off. Put another way, if the first load connection switch is turned on, load 150 is connected to first battery bank 110 and if the second load connection switch is turned on, load 150 is connected to second battery bank 120.

Figure 2:
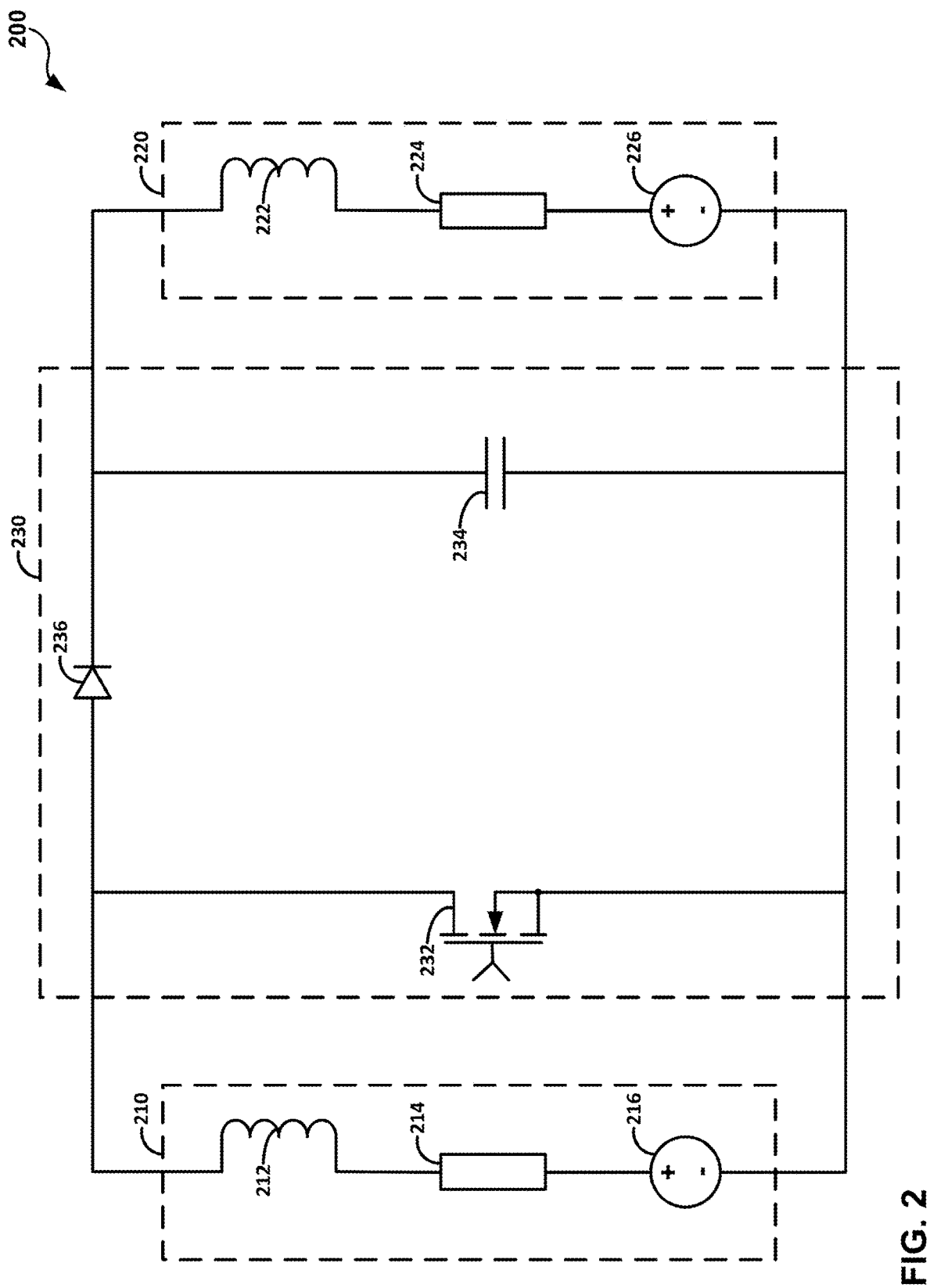
FIG. 2 is a circuit diagram of a system including a first battery bank, a second battery bank, and a circuit, in accordance with one or more techniques of this disclosure.

FIG. 2 is a circuit diagram of a system 200 including a first battery bank 210, a second battery bank 220, and a circuit 230, in accordance with one or more techniques of this disclosure. First battery bank 210 includes first internal inductance 212, first internal resistance 214, and first power source 216. Second battery bank 220 includes second internal inductance 222, second internal resistance 224, and second power source 226. Circuit 230 includes switching element 232, capacitor 234, and diode 236. First battery bank 210 may be an example of first battery bank 110 of FIG. 1. Second battery bank 220 may be an example of second battery bank 120 of FIG. 1. Circuit 230 may be an example of circuit 130 of FIG. 1.

First battery bank 210 may, in some examples, include a plurality of cells placed in series. The plurality of cells may include lithium-ion cells, lead-acid cells, nickel metal hydride cells, or any combination thereof. First battery bank 210 may include a positive terminal and a negative terminal. In some examples, when electrical current is drawn through first battery bank 210 from the negative terminal to the positive terminal, power is drained from first battery bank 210. Alternatively, in some examples, when electrical current flows through first battery bank 210 from the positive terminal to the negative terminal, first battery bank 210 is recharged.

Inductors are electrical circuit components that resist change in a magnitude of electrical current passing through the inductor. In some examples, inductors are defined by an electrically conductive wire that is wrapped in a coil. As electrical current passes through the coil, a magnetic field is created in the coil, and the magnetic field induces a voltage across the inductor. An inductor defines an inductance value, and the inductance value is the ratio of the voltage across the inductor to the rate of change of current passing through the inductor. Although inductors are distinct and identifiable electrical circuit components, other electrical circuit components that are not inductors may behave, in some ways, like inductors. For example, capacitors, resistors, batteries, semiconductor elements, and other types of electrical circuit components may define an inductance value, even though inductance may not be an "intended" property of these components.

Although first battery bank 210 may not resemble a physical inductor component (e.g., a wire wrapped in a coil), first battery bank 210 may define first internal inductance 212. As such, first battery bank 210 may exhibit at least some properties of a physical inductor component when first battery bank 210 is connected to circuit 230. For example, the physical structure of first battery bank 210 may resist a change in the magnitude of electrical current passing through the physical structure of first battery bank 210. As such, first internal inductance 212 may not define a physical circuit component. Rather, first internal inductance 212 may define an intrinsic property of first battery bank 210 that is inseparable from the structure of first battery bank 210. First internal inductance 212 may correspond to a first inductance value, and in one example, the first inductance value is within a range between 1 microhenry and 20 microhenries. First battery bank 210, by nature of first internal inductance 212, may resist a change in a magnitude of current flowing through first battery bank 210. Therefore, if a current-drawing circuit connected to first battery bank 210 is broken, first battery bank 210 may continue to emit an excess current for a period of time due to the first internal inductance 212 resisting change in the magnitude of the current flowing through first battery bank 210.

Additionally, first battery bank 210 may define first internal resistance 214. Like first internal inductance 212, first internal resistance 214 is represented by an independent circuit component. Rather, first internal resistance 214 is an intrinsic property of first battery bank 210 that is inseparable from the physical structure of first battery bank 210. The physical structure of first battery bank 210, like a conventional resistor, may resist current flowing across first battery bank 210. In this way, when electrical current flows across the physical structure of first battery bank 210, first battery bank 210 gives off heat and a temperature of first battery bank 210 increases due to the Joule effect. In some examples, first internal resistance 214 may define a resistance value within a range between 1 milliohm (mΩ) and 5 mΩ.

In some cases, internal resistance is referred to as "parasitic resistance," and internal inductance is referred to as "parasitic inductance."

First battery bank 210 may also define first power source 216, which gives a voltage output value. Voltage, defined as the difference in electric potential between two points, may drive current through a circuit. In the example illustrated in FIG. 2, first power source 216 is the difference in electric potential between the positive terminal and the negative terminal of first battery bank 210. In some examples, first power source 216 may define a maximum voltage output of 400 Volts.

In the example illustrated in FIG. 2, second battery bank 220 includes second internal inductance 222, second internal resistance 224, and second power source 226. In some examples, second battery bank 220 is a replica or a near-replica of first battery bank 110. For example, second battery bank 220 may be composed of the same materials as first battery bank 210, second battery bank 220 may be approximately the same size (e.g., length, width, and volume) as first battery bank 210, and second battery bank 220 may include the same number of cells as first battery bank 210. In other examples, second battery bank 220 may differ from first battery bank 210 in at least one of material composition, size, and number of cells. In some examples, second power source 226 may define a maximum voltage output of 400 Volts.

First battery bank 210 and second battery bank 220 may be connected in parallel. As such, according to Kirchoff's voltage law (KVL), when first battery bank 210 and second battery bank 220 (collectively, "battery banks 210, 220") are connected to a load (e.g., load 150 of FIG. 1), a voltage output of first battery bank 210 may be equal or almost equal to a voltage output of second battery bank 220.

In some cases, it may be undesirable to power the load using battery banks 210, 220 when battery banks 210, 220 are at a particularly cold temperature, such as a temperature below zero degrees Celsius. If battery banks 210, 220 are used to power the load in freezing temperatures, battery banks 210, 220 may consume an increased amount of energy to cause the chemical reactions which enable battery banks 210, 220 to output power. As such, powering the load using battery banks 210, 220 at freezing temperatures may decrease an efficiency of battery banks 210, 220. Additionally, using battery banks 210, 220 to power the load while the temperature of battery banks 210, 220 is below zero degrees Celsius may permanently damage battery banks 210, 220 such that an energy capacity of battery banks 210, 220 is decreased even when the temperature of battery banks 210, 220 are warmer than zero degrees Celsius.

Circuit 230 may be configured to perform a battery warm-up procedure which increases a temperature of battery banks 210, 220 until the temperature of battery banks 210, 220 is high enough for battery banks 210, 220 to power the load without causing permanent damage to battery banks 210, 220. For example, circuit 230 may increase the temperature of battery banks 210, 220 above a temperature threshold value. In some examples, the temperature threshold value is zero degrees Celsius.

Switching element 232 may, in some cases, include a power switch such as, but not limited to, any type of field-effect transistor including any combination of a MOSFET, a BJT, an IGBT, a JFET, an HEMT, or another element that uses voltage for control. Additionally, switching element 232 may include n-type transistors, p-type transistors, and power transistors, or any combination thereof. In some examples, switching element 232 includes vertical transistors, lateral transistors, and/or horizontal transistors. In some examples, switching element 232 includes other analog devices such as diodes and/or thyristors. In some examples, switching element 232 may operate as a switch and/or as an analog device.

In some examples, switching element 232 includes three terminals: two load terminals and a control terminal. For MOSFET switches, switching element 232 may include a drain terminal, a source terminal, and at least one gate terminal, where the control terminal is a gate terminal. For BJT switches, the control terminal may be a base terminal. Current may flow between the two load terminals of switching element 232, based on the voltage at the control terminal. Therefore, electrical current may flow across switching element 232 based on control signals delivered to the control terminal of switching element 232 by a controller (e.g., control circuit 140 of FIG. 1). In one example, a voltage magnitude of 10V must be applied to the control terminal of switching element 232 in order to turn switching element 232 'on,' allowing switching element 232 to conduct electricity. In other examples, other voltage magnitudes may be required to activate switching element 232. Furthermore, switching element 232 may be turned 'off' when the voltage magnitude applied to the control terminal of switching element 232 is decreased.

Switching element 232 may include various material compounds, such as Silicon, Silicon Carbide, Gallium Nitride, or any other combination of one or more semiconductor materials. In some examples, silicon carbide switches may experience lower power losses. Fast switching devices may allow switching element 232 to draw short bursts of current from a battery (e.g., battery banks 210, 220). In some examples, fast switching devices may include Gallium Nitride switches, which may have faster switching speeds than silicon switches or silicon carbide switches. These higher frequency switching elements may require control signals to be sent with more precise timing, as compared to lower-frequency switching elements. In some examples, switching element 232 may be a fast switching element. For example, a switching cycle of switching element 232 may include an 'on' phase lasting greater than 1.5 microseconds (μs) and less than 2.5 μs, and an 'off' phase lasting greater than 15 microseconds and less than 30 microseconds. In one example, a drain terminal of switching element 232 is electrically connected to the positive terminal of first battery bank 210 and a source terminal of switching element 232 is electrically connected to the negative terminal of first battery bank 210.

In some examples, switching element 232 is configured to draw a current from first battery bank 210 when switching element 232 is turned on. For example, a controller (e.g., control circuit 140 of FIG. 1) may apply a voltage to the control terminal of switching element 232, allowing switching element 232 to conduct electricity. When switching element 232 is turned on, switching element 232 creates a short circuit between the positive terminal and the negative terminal of first battery bank 210, thus inducing a current across first battery bank 210 and switching element 232. Since the current flows through the physical structure of first battery bank 210, and by extension flows through first internal resistance 214, first battery bank 210 gives off heat due to the Joule effect. As such, the current induced by switching element 232 increases the temperature of first battery bank 210.

When switching element 232 is turned on, the current flowing through first battery bank 210 may increase until it reaches a maximum current magnitude. In some examples, the maximum current magnitude is within a range between 50 Amperes and 500 Amperes. For example, after switching element 232 is on for a period of time lasting 2 µs, the magnitude of the current flowing through first battery bank 210 may be 300 Amperes. First internal inductance 212 resists a change in the magnitude of electrical current flowing through first battery bank 210. In this way, when switching element 232 is turned off, first battery bank 210 emits an excess current to second battery bank 220, via diode 236. The excess current may decrease, starting at a time in which switching element 232 is turned off, from a maximum excess current magnitude. In some examples, switching element 232 is off for a period of time lasting 20 µs and the excess current decreases from a maximum excess current value of 300 Amperes to zero amperes over the period of time. Example current magnitude values and time durations described herein are not intended to be limiting. The maximum current magnitude, the maximum excess current magnitude, and the duration of the 'on' phases and 'off' phases of switching element 232 may be any value or range of values.

In some examples, circuit 230 may deliver at least some of the excess current to second battery bank 220. Circuit 230 may deliver the excess current to the positive terminal of second battery bank 220, meaning that the excess current flows through second battery bank 220 from the positive terminal to the negative terminal. As such, the excess current may charge second battery bank 220. Since the excess current flows through the physical structure of second battery bank 220, the excess current crosses the physical structure of second battery bank 220, which defines second internal resistance 224, causing the temperature of second battery bank 220 to increase due to the Joule effect. Additionally, in the example illustrated in FIG. 2, circuit 230 is configured to deliver at least some of the excess current to capacitor 234.

Capacitor 234 is an electrical circuit component configured for storing electric potential energy. Capacitor 234 may, in some examples, occupy a "charged" state, where capacitor 234 stores a maximum amount of electric potential energy. Additionally, capacitor 234 may occupy a "discharged" state where capacitor 234 stores little or no electric potential energy. Capacitor 234 may also transition between the charged state and the discharged state. When capacitor 234 is charging, a current flows across capacitor 234, increasing the electric potential energy stored by capacitor 234. When capacitor 234 is discharging, the electric potential energy stored by capacitor 234 is released, causing capacitor 234 to emit an electric current.

The excess current delivered to capacitor 234 by circuit 230 while switching element 232 is turned off may charge capacitor 234. In some examples, the excess current charges capacitor 234 to a full capacity. In other examples, the excess current charges capacitor 234 to less than a full capacity. After switching element 232 is turned on, capacitor 234 discharges, releasing a second current to second battery bank 220. In some examples, capacitor 234 releases the second current to the positive terminal of second battery bank 220, the second current charging second battery bank 220 and increasing the temperature of second battery bank 220.

Put another way, circuit 230 may operate in two phases. During a first phase, switching element 232 is on, causing a first current to flow through first battery bank 210 and switching element 232, and causing a second current to flow from discharging capacitor 234 through second battery bank 220. During a second phase, switching element 232 is off and first battery bank 210 emits an excess current which charges capacitor 234 and flows through second battery bank 220. A magnitude of the first current, in the example of FIG. 2, is greater than a magnitude of the second current. As a consequence, the temperature of first battery bank 210 increases at a faster rate than the temperature of second battery bank 220. In one example, circuit 230 takes 18.7 minutes to increase the temperature of first battery bank 210 by 25 degrees Celsius and circuit 230 takes 37.6 minutes to increase the temperature of second battery bank 220 by 25 degrees Celsius. Additionally, over a period of time, second battery bank 220 may charge and first battery bank 210 may spend power. In this way, when performing the battery warm-up procedure, circuit 230 may operate "asymmetrically," causing an imbalance between the temperatures of battery banks 210, 220 and the charge levels of battery banks 210, 220.

Figure 3:
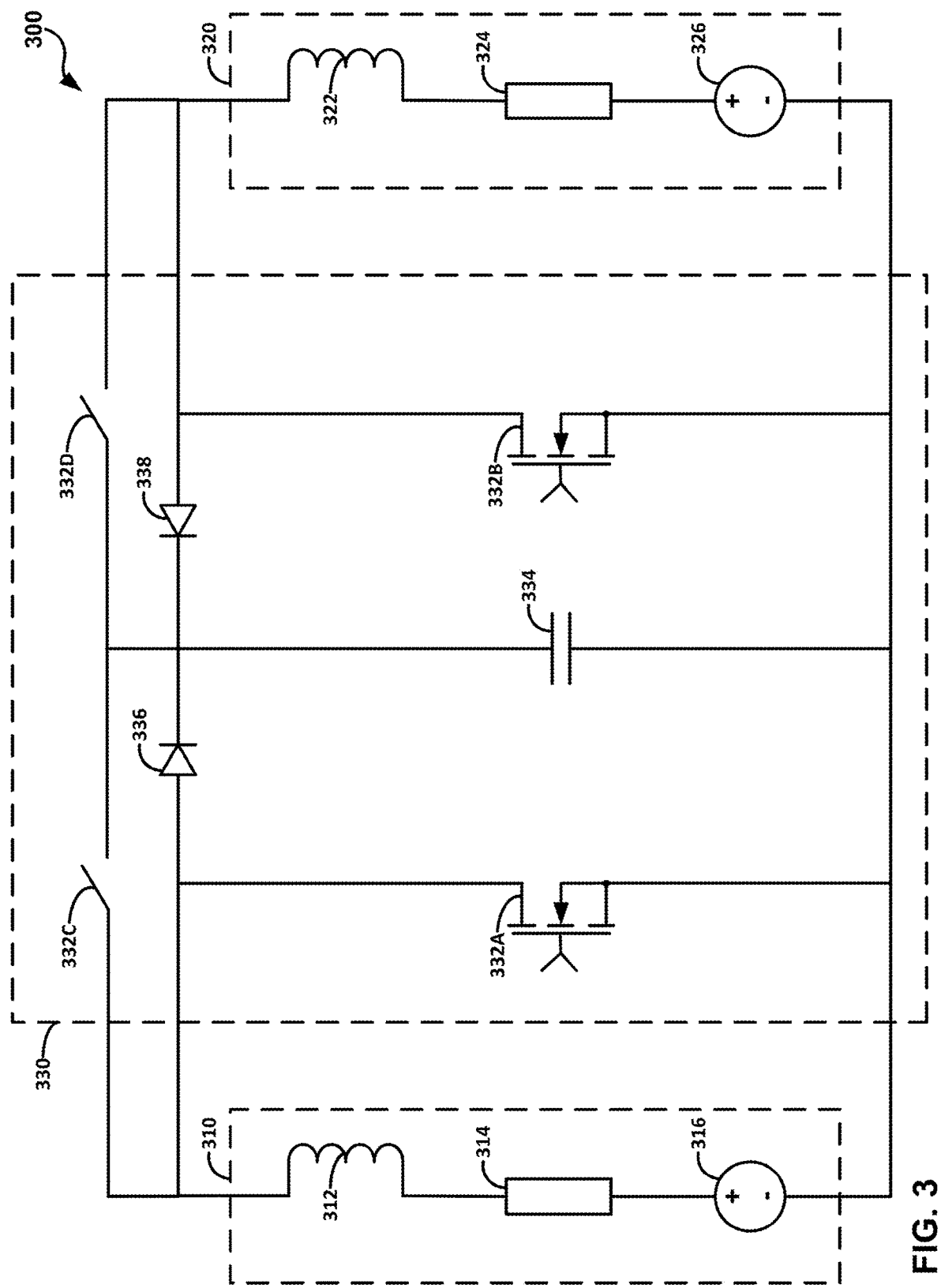
FIG. 3 is a circuit diagram of another system including a first battery bank, a second battery bank, and a circuit, in accordance with one or more techniques of this disclosure.

FIG. 3 is a circuit diagram of a system 300 including a first battery bank 310, a second battery bank 320, and a circuit 330, in accordance with one or more techniques of this disclosure. First battery bank 310 includes first internal inductance 312, first internal resistance 314, and first power source 316. Second battery bank 320 includes second internal inductance 322, second internal resistance 324, and second power source 326. Circuit 330 includes switching elements 332A-332D (collectively, "switching elements 332"), capacitor 334, diode 336, and diode 338. First battery bank 310 may be an example of first battery bank 110 of FIG. 1. Second battery bank 320 may be an example of second battery bank 120 of FIG. 1. Circuit 330 may be an example of circuit 130 of FIG. 1.

In the example of FIG. 3, first battery bank 310 and second battery bank 320 (collectively, "battery banks 310, 320") may be the same or similar to battery banks 210, 220 of FIG. 2. As such, Battery banks 310, 320 may, in some examples, each include a plurality of cells arranged in series. The plurality of cells may include lithium-ion cells, lead-acid cells, nickel metal hydride cells, or any combination thereof.

In some examples, for using battery banks 310, 320 to power a load (e.g., load 150 of FIG. 1), it may be beneficial for the temperature of battery banks 310, 320 to be above a temperature threshold value. Circuit 330 may be configured to perform a battery warm-up procedure which increases the temperature of battery banks 310, 320 until the temperature is high enough for the battery to power the load without causing permanent damage to battery banks 310, 320. In some examples, it is desirable to heat up first battery bank 310 and second battery bank 320 at about the same rate. The battery warm-up procedure, as performed by circuit 330, may balance the rates in which first battery bank 310 and second battery bank 320 heat up. Consequently, the battery warm-up procedure of circuit 330 may generally prevent first battery bank 310 from heating up faster than second battery bank 320 and likewise generally prevent second battery bank 320 from heating up faster than first battery bank 310. Additionally, in some examples, the battery warm-up procedure of circuit 330 may promote an equilibrium in energy transfer between battery banks 310, 320.

In the example of FIG. 3, during the battery heat-up procedure, circuit 330 may balance the charge levels and the temperatures of battery banks 310, 320 by alternating between a first switching mode and the second switching mode. For example, while operating in the first switching mode, circuit 330 is configured to use first battery bank 310 to charge second battery bank 320. While operating in the second switching mode, circuit 330 is configured to use second battery bank 320 to charge first battery bank 310. By alternating between the first switching mode and the second switching mode, circuit 330 is configured to balance the temperatures and the charge levels of battery banks 310, 320.

A controller (e.g., control circuit 140 of FIG. 1) may control switching elements 332 to alternate between the first switching mode and the second switching mode. In some examples, at least one of switching elements 332 is an example of switching element(s) 132 of FIG. 1. In some examples, switching element 332A and switching element 332B are fast switching devices which require precise control signals from the controller for operation. Switching elements 332A and switching element 332B may, in some examples, include any combination of silicon MOSFETs, silicon JFETs, super-junction MOSFETs, Gallium Nitride HEMTs, Gallium Nitride MOSFETs, Silicon Carbide MOSFETs, or Silicon Carbide JFETs. In some examples, switching elements 332C and 332D are slow switching devices such as electro-mechanical-based switching devices (e.g., relays).

While circuit 330 is operating in the first switching mode, the controller may be configured to control circuit 330 to charge second battery bank 320 using first battery bank 310. For example, while circuit 330 is operating in the first switching mode, the controller may operate (e.g., turn 'on' and turn 'off') switching element 332A while switching element 332B is turned off, switching element 332C is turned off, and switching element 332D is turned on. In some examples, circuit 330 is configured to draw, using switching element 332A, a first current from first battery bank 310 when switching element 332A is turned on. For example, when switching element 332A is turned on, switching element 332A creates a short circuit between the positive terminal and the negative terminal of first battery bank 310, thus inducing a current across first battery bank 310 and switching element 332A. Since the current flows through the physical structure of first battery bank 310, and by extension flows through first internal resistance 314, first battery bank 310 gives off heat due to the Joule effect. As such, the first current induced by switching element 332A increases the temperature of first battery bank 310.

First battery bank 310 is configured to emit a first excess current after switching element 332A is turned off and circuit 330 is configured to deliver at least some of the first excess current to second battery bank 320. Additionally, circuit 330 may charge capacitor 334 using at least some of the first excess current. Inductive properties of first battery bank 310 (e.g., first internal inductance 312) may cause first battery bank 310 to emit the first excess current. In the example illustrated in FIG. 3, first battery bank 310 releases the first excess current through diode 336 and switching element 332D to the positive terminal of second battery bank 320. The first excess current flows through second battery bank 320 from the positive terminal to the negative terminal. Second battery bank 320 may give off heat since the first excess current crosses second internal resistance 324. Thus, the first excess current may recharge second battery bank 320, and the first excess current may increase the temperature of second battery bank 320 due to the Joule effect.

Switching element 332A turns on, in some cases, after capacitor 334 is charged using the first excess current. After switching element 332A turns on, capacitor 334 discharges, releasing a second current to second battery bank 320 via switching element 332D.

During the first switching mode, circuit 330 may operate in two phases. During a first phase, switching element 332A is on, causing the first current to flow through first battery bank 310 and switching element 332A, and causing the second current to flow from discharging capacitor 334 through switching element 332D to second battery bank 320. During a second phase, switching element 332A is off and first battery bank 310 emits the first excess current. Circuit 330 may use at least some of the first excess current to charge capacitor 334. Additionally, circuit 330 delivers at least some of the first excess current to second battery bank 320 via diode 336 and switching element 332D. The second current and the first excess current, in some examples, flow through second battery bank 320 from the positive terminal to the negative terminal.

A magnitude of the first current, in the example of FIG. 3, is greater than a magnitude of the second current. In some examples, the first internal resistance 314 of first battery bank 310 is equal to or almost equal to the second internal resistance 324 of second battery bank 320. Consequently, the temperature of first battery bank 310 increases at a faster rate than the temperature of second battery bank 320. Additionally, over a period of time that circuit 330 is operating in the first switching mode, second battery bank 320 may charge and first battery bank 310 may spend power. In this manner, during the period of time that circuit 330 is operating in the first switching mode, an imbalance in temperature and charge may form between battery banks 310, 320. To correct for the imbalance, circuit 330 may transition to second switching mode.

The controller (e.g., control circuitry 140) may turn switching element 332C on and turn switching element 332D off to transition circuit 330 to the second switching mode. In some examples, circuit 330 is configured to draw, using switching element 332B, a third current from second battery bank 320 when switching element 332B is turned on. For example, when switching element 332B is turned on, switching element 332B creates a short circuit between the positive terminal and the negative terminal of second battery bank 320, thus inducing a current across second battery bank 320 and switching element 332B. Since the current flows through the physical structure of second battery bank 320, and by extension flows through second internal resistance 324, second battery bank 320 gives off heat due to the Joule effect. As such, the third current induced by switching element 332B increases the temperature of second battery bank 320.

Second battery bank 320 is configured to emit a second excess current after switching element 332B is turned off. Circuit 330 is configured to deliver at least some of the second excess current to first battery bank 310 when switching element 332B is turned off. Additionally, circuit 330 may charge capacitor 334 using at least some of the second excess current. Inductive properties of second battery bank 320 (e.g., second internal inductance 322) may cause second battery bank 320 to emit the second excess current. In the example illustrated in FIG. 3, second battery bank 320 releases the second excess current through diode 338 and switching element 332C to the positive terminal of first battery bank 310. The second excess current flows through first battery bank 310 from the positive terminal to the negative terminal. First battery bank 310 may give off heat since the second excess current crosses first internal resistance 314. Thus, the second excess current may recharge first battery bank 310, and the second excess current may increase the temperature of first battery bank 310.

Switching element 332B turns on, in some cases, after capacitor 334 is charged using the second excess current. After switching element 332B turns on, capacitor 334 discharges, releasing a fourth current to first battery bank 310 via switching element 332C.

During the second switching mode, circuit 330 may operate in two phases. During a first phase, switching element 332B is on, causing a third current to flow through second battery bank 320 and switching element 332B, and causing the fourth current to flow from discharging capacitor 334 through switching element 332C to first battery bank 310. During a second phase, switching element 332B is off and second battery bank 320 emits a second excess current. Circuit 330 may use at least some of the second excess current to charge capacitor 334. Additionally, circuit 330 delivers at least some of the second excess current to first battery bank 310 via diode 338 and switching element 332C. The fourth current and the second excess current, in some examples, flow through first battery bank 310 from the positive terminal to the negative terminal.

To balance the temperature and the charge of battery banks 310, 320 during the battery heat-up process of system 300, the controller (e.g., control circuit 140 of FIG. 1) may cause circuit 330 to alternate between the first switching mode and the second switching mode according to one or more techniques, which are described in further detail below. To alternate between the first switching mode and the second switching mode, the controller deliver electric signals to the control terminals of switching elements 332, thus configuring circuit 330 to operate in a respective switching mode.

In some examples, circuit 330 is configured to operate in the first switching mode during a plurality of primary phases, where each primary phase of the plurality of primary phases lasts for a first amount of time. Additionally, circuit 330 is configured to operate in the second switching mode during a plurality of secondary phases, where each secondary phase of the plurality of secondary phases lasts for a second amount of time. Circuit 330 may interleave the plurality of primary phases and the plurality of secondary phases such that a primary phase is followed by a secondary phase, and the secondary phase is followed by a consecutive primary phase. In other words, circuit 330 may alternate between the first switching mode and the second switching mode at predetermined time intervals. In some examples, the first amount of time is equal to the second amount of time. In some examples, the first amount of time and the second amount of time are greater than one minute and less than five minutes.

In some examples, a first temperature sensor (not illustrated in FIG. 3) is configured to measure the temperature of first battery bank 310 and a second temperature sensor (not illustrated in FIG. 3) is configured to measure the temperature of second battery bank 320. Based on the measured temperatures of battery banks 310, 320, the controller may change circuit 330 from operating in the first switching mode to operating in the second switching mode if the temperature of first battery bank 310 is greater than the temperature of second battery bank 320 by more than a temperature difference threshold. Additionally, the controller may change circuit 330 from operating in the second switching mode to operating in the first switching mode if the temperature of second battery bank 320 is greater than the temperature of first battery bank 310 by more than the temperature difference threshold. In some examples, the temperature difference threshold is greater than 1° Celsius and less than 5° Celsius. However, in other examples, other temperature difference thresholds may be used. The temperature difference threshold may be any temperature value or range of temperature values.

In some examples, a first voltage sensor (not pictured in FIG. 3) is configured to measure a magnitude of a voltage of first battery bank 310 and a second voltage sensor (not pictured in FIG. 3) is configured to measure a magnitude of a voltage of second battery bank 320. The controller is configured to change circuit 330 from operating in the first switching mode to operating in the second switching mode if the magnitude of the voltage of first battery bank 310 is less than the magnitude of the voltage of second battery bank 320 by more than a voltage difference threshold. Additionally, the controller is configured to change circuit 330 from operating in the second switching mode to operating in the first switching mode if the magnitude of the voltage of second battery bank 320 is less than the magnitude of the voltage of first battery bank 310 by more than the voltage difference threshold. In some examples, the voltage difference threshold is greater than 5 Volts and less than 20 Volts. However, in other examples, other voltage difference thresholds may be used.

Figure 4:
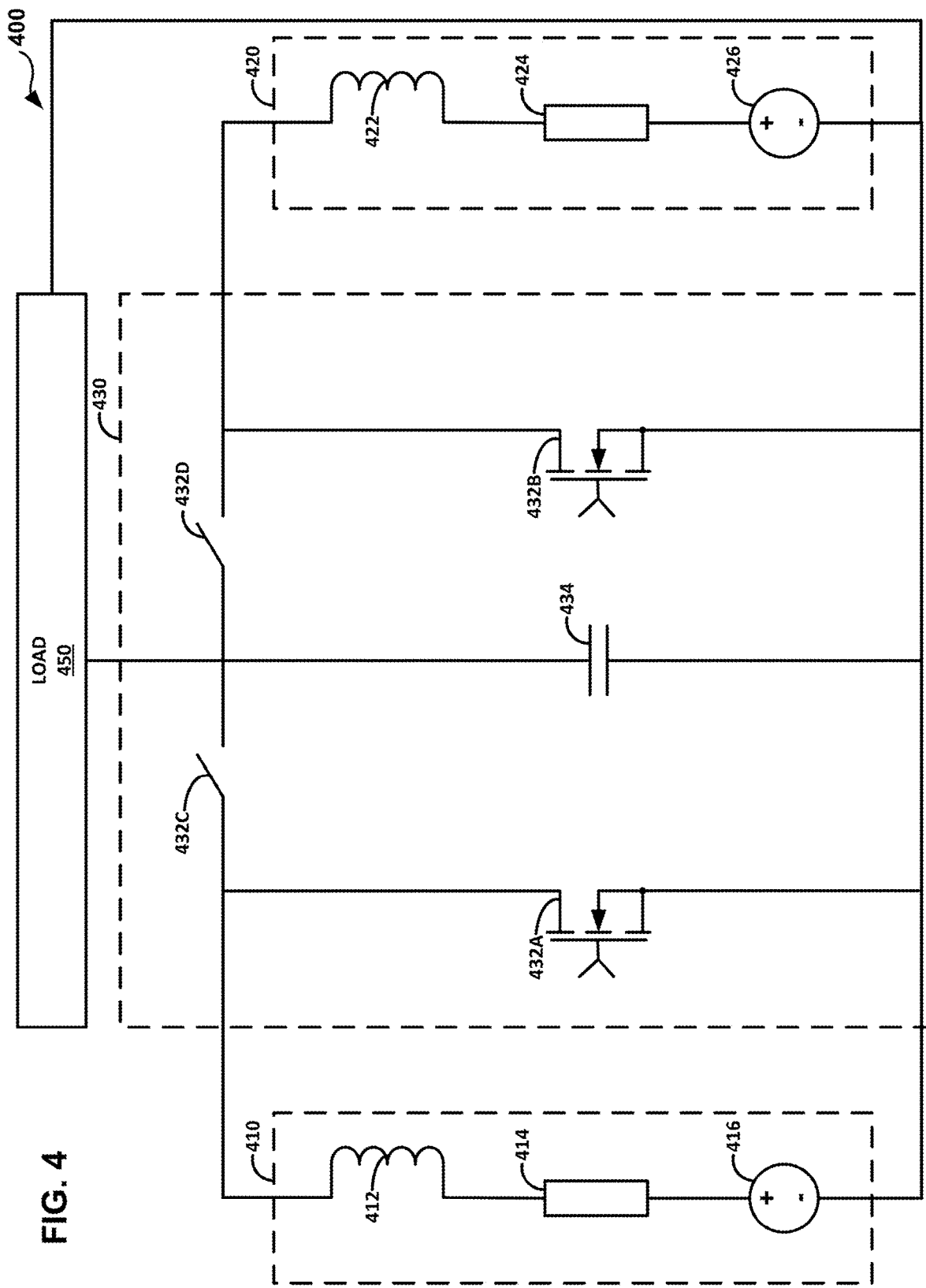
FIG. 4 is a circuit diagram of a system including a first battery bank, a second battery bank, a circuit, and a load, in accordance with one or more techniques of this disclosure.

FIG. 4 is a circuit diagram of a system 400 including a first battery bank 410, a second battery bank 420, a circuit 430, and a load 450, in accordance with one or more techniques of this disclosure. First battery bank 410 includes first internal inductance 412, first internal resistance 414, and first power source 416. Second battery bank 420 includes second internal inductance 422, second internal resistance 424, and second power source 426. Circuit 430 includes switching elements 432A-432D (collectively, "switching elements 432") and capacitor 434. First battery bank 410 may be an example of first battery bank 110 of FIG. 1. Second battery bank 420 may be an example of second battery bank 120 of FIG. 1. Circuit 430 may be an example of circuit 130 of FIG. 1. Load 450 may be an example of load 150 of FIG. 1.

Circuit 430 may, in some cases, perform a battery heat-up procedure to increase temperatures of first battery bank 410 and second battery bank 420 (collectively, "battery banks 410, 420). For example, A controller (e.g., control circuit 140 of FIG. 1) may be configured to control switching elements 432 of circuit 430 to alternate between a first switching mode and a second switching mode. During both of the first switching mode and the second switching mode, switching element 432C and switching element 432D may be turned on. Switching elements 432 may be examples of switching element(s) 132 of FIG. 1. Switching elements 432A and 432B may, in some examples, include any combination of silicon MOSFETs, silicon JFETs, super-junction MOSFETs, Gallium Nitride HEMTs, Gallium Nitride MOSFETs, Silicon Carbide MOSFETs, or Silicon Carbide JFETs.

In some examples, switching elements 432C and 432D are slow switching devices such as electro-mechanical-based switching devices (e.g., relays). In some examples, each of switching elements 432C and 432D include a body diode.

During the first switching mode, circuit 430 may operate in two phases. During a first phase, switching element 432A is on, causing a first current to flow through first battery bank 410 and switching element 432A, and causing a second current to flow from discharging capacitor 434 through switching element 432D to second battery bank 420. During a second phase, switching element 432A is off and first battery bank 410 emits a first excess current. Circuit 430 may use at least some of the first excess current to charge capacitor 434. Additionally, circuit 430 delivers at least some of the first excess current to second battery bank 420 via switching element 432D. The second current and the first excess current, in some examples, flow through second battery bank 420 from the positive terminal to the negative terminal.

During the second switching mode, circuit 430 may operate in two phases. During a first phase, switching element 432B is on, causing a third current to flow through second battery bank 420 and switching element 432B, and causing a fourth current to flow from discharging capacitor 434 through switching element 432C to first battery bank 410. During a second phase, switching element 432B is off and second battery bank 420 emits a second excess current. Circuit 430 may use at least some of the second excess current to charge capacitor 434. Additionally, circuit 430 delivers at least some of the second excess current to first battery bank 410 via switching elements 432C and 432D. The fourth current and the second excess current, in some examples, flow through first battery bank 410 from the positive terminal to the negative terminal.

Based on data from any combination of temperature sensors and voltage sensors, circuit 430 may alternate between the first switching mode and the second switching mode to balance the temperatures and charge levels of battery banks 410, 420. While performing the battery warm-up procedure, circuit 430 may refrain from delivering power to load 450.

After the temperatures of battery banks 410, 420 increase above a temperature threshold value, the battery warm-up procedure may be concluded. Subsequently, circuit 430 may connect any combination of battery banks 410, 420 to load 450. For example, circuit 430 may deliver an electric current from first battery bank 410 to load 450 via switching element 432C and circuit 430 may deliver an electric current from second battery bank 420 to load 450 via switching element 432D. At any time, circuit 430 may disconnect load 450 from first battery bank 410 by turning off switching element 432C. Additionally, at any time, circuit 430 may disconnect second battery bank 420 from load 450 by turning off switching element 432D.

Figure 5:
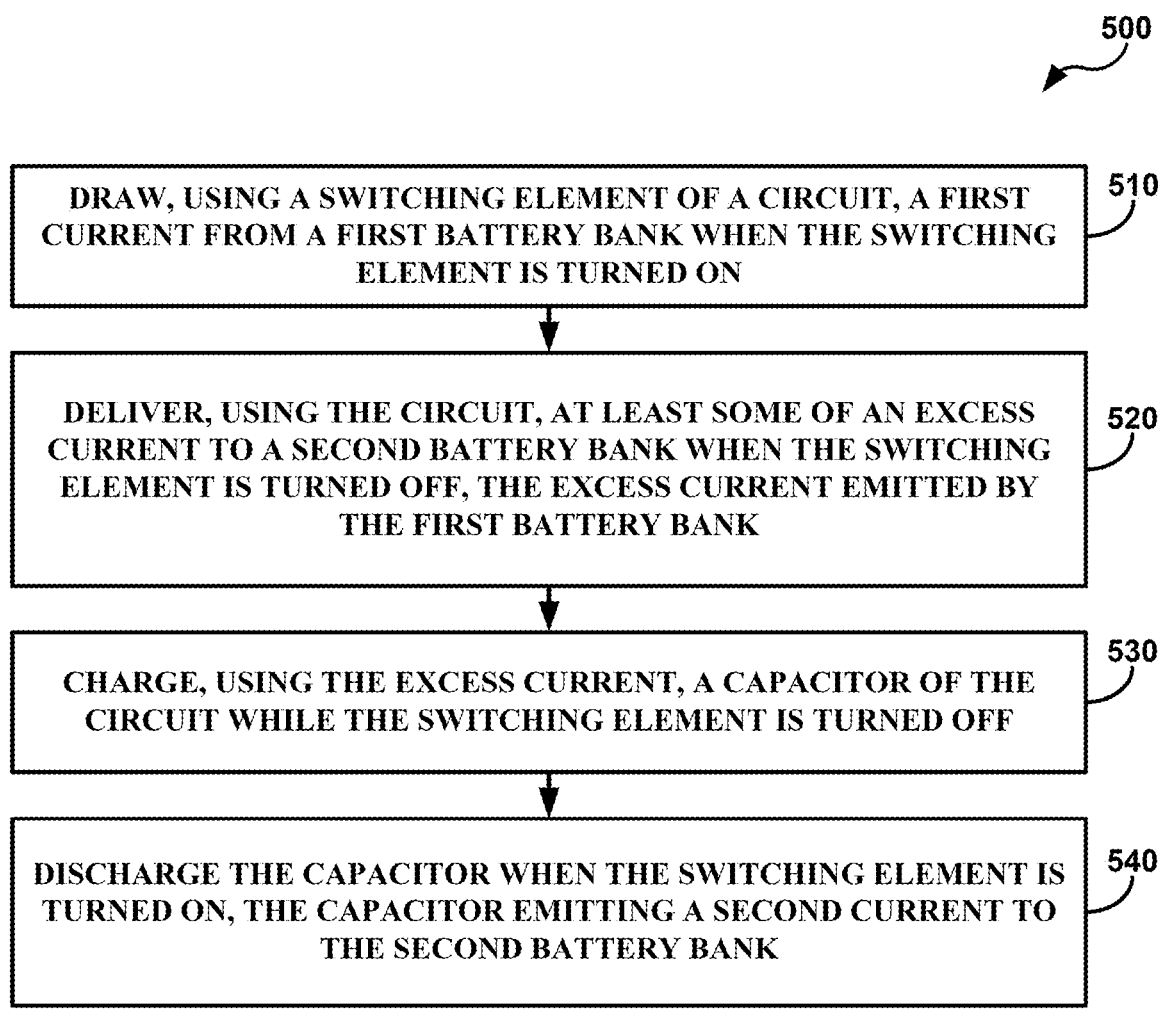
FIG. 5 is a flow diagram illustrating example techniques for heating up a first battery bank and a second battery bank using a circuit, in accordance with one or more techniques of this disclosure.

FIG. 5 is a flow diagram illustrating example techniques for heating up a first battery bank and a second battery bank using a circuit, in accordance with one or more techniques of this disclosure. The techniques of FIG. 5 are described with respect to system 100 shown in FIG. 1, although other systems, such as systems 200, 300, and 400 shown in FIGS. 2-4 may exemplify similar techniques.

In the example of FIG. 5, circuit 130 is configured to draw, using a switching element of switching element(s) 132, a current from first battery bank 110 when the switching element is turned on (510). By turning on the switching element, circuit 130 may create a short circuit between the positive terminal and the negative terminal of first battery bank 110, inducing a first current through first battery bank 110. A physical structure of first battery bank 110 may define a resistance value such that the physical structure of first battery bank 110 releases heat when the first current flows through first battery bank 110. The release of the heat by first battery bank 110 causes a temperature of first battery bank 110 to increase. Additionally, while the switching element is drawing the first current from first battery bank 110, a charge level of first battery bank 110 decreases. In other words, the first current may represent an expenditure of at least some of the power stored by first battery bank 110.

When the switching element is turned off, circuit 130 may be configured to deliver at least some of an excess current to second battery bank 120, the excess current emitted by first battery bank 110 (520). An internal inductance of first battery bank 110, resisting a change from the first current through first battery bank 110, may cause first battery bank 110 to emit the excess current. Circuit 130 may deliver the excess current to second battery bank 120 such that the excess current crosses an internal resistance of second battery bank 120, causing second battery bank 120 to heat up. Additionally, circuit 130 may include a capacitor. Circuit 130 charges the capacitor using the excess current when the switching element is turned off (530). When the switching element is turned on, circuit 130 discharges the capacitor, the capacitor emitting a second current to second battery bank 120 (540). The second current, like the excess current, may cause second battery bank 120 to heat up. The excess current and the second current may cross second battery bank 120 from the positive terminal to the negative terminal, such that the excess current and the second current recharge second battery bank 120. The example of FIG. 5 may cause first battery bank 110 to heat up faster than second battery bank 120, and the example of FIG. 5 may also cause first battery bank 110 to lose charge and cause second battery bank 120 to gain charge.

Although the example of FIG. 5 describes a system in which first battery bank 110 heats up faster than second battery bank 120, some of the techniques described with respect to FIG. 5 may be applied to heat up second battery bank 120 faster than first battery bank 110. For example, a multi-directional battery heat-up circuit (e.g., circuit 330 of FIG. 3) may balance the rates in which the two battery banks heat up.

The following numbered examples demonstrate one or more aspects of the disclosure.

EXAMPLE 1

A circuit includes a switching element. The circuit is configured to draw, using the switching element, a current from a first battery bank when the switching element is turned on, the first battery bank emitting an excess current after the switching element is turned off, where the current increases a temperature of the first battery bank and deliver at least some of the excess current to a second battery bank when the switching element is turned off, where the excess current charges the second battery bank, and where the excess current increases a temperature of the second battery bank.

EXAMPLE 2

The circuit of example 1, where the current increases the temperature of the first battery bank by crossing a resistance of the first battery bank, and where the excess current increases the temperature of the second battery bank by crossing a resistance of the second battery bank.

EXAMPLE 3

The circuit of examples 1-2 or any combination thereof, where the current includes a first current, where the circuit further includes a capacitor, and where the circuit is further configured to charge, using the excess current, the capacitor while the switching element is turned off, and discharge the capacitor when the switching element is turned on, the capacitor emitting a second current to the second battery bank, where the second current charges the second battery bank, and where the second current increases a temperature of the second battery bank.

EXAMPLE 4

The circuit of examples 1-3 or any combination thereof, where the switching element includes a first switching element, where the circuit further includes a second switching element, and where the circuit is further configured to operate in a first switching mode and operate in a second switching mode, where to operate in the first switching mode, the circuit is configured to charge, using the excess current and the second current, the second battery bank while the second switching element is turned off, and where to operate in the second switching mode, the circuit is configured to charge the first battery bank while the first switching element is turned off.

EXAMPLE 5

The circuit of examples 1-4 or any combination thereof, where the excess current includes a first excess current. To operate in the second switching mode, the circuit is configured to draw a third current from the second battery bank when the second switching element is turned on, the second battery bank emitting a second excess current after the second switching element is turned off, and deliver at least some of the second excess current to the first battery bank when the second switching element is turned off. Additionally, the circuit is configured to charge, using the second excess current, the capacitor while the second switching element is turned off and discharge the capacitor when the second switching element is turned on, the capacitor emitting a fourth current to the first battery bank, where the third current increases the temperature of the second battery bank, where the second excess current increases the temperature of the first battery bank, and where the fourth current increases the temperature of the first battery bank.

EXAMPLE 6

The circuit of examples 1-5 or any combination thereof, where the circuit further includes a third switching element, a fourth switching element, a first diode, and a second diode. To operate in the first switching mode, the circuit is further configured to deliver, while the third switching element is turned off and the fourth switching element is turned on, the at least some of the first excess current to the second battery bank via the first diode. Additionally, to operate in the second switching mode, the circuit is further configured to deliver, while the third switching element is turned on and the fourth switching element is turned off, the at least some of the second excess current to the first battery bank via the second diode.

EXAMPLE 7

The circuit of examples 1-6 or any combination thereof, where the circuit further includes a third switching element and a fourth switching element. The circuit is further configured to connect a load to the first battery bank and the second battery bank when the third switching element is turned on and the forth switching element is turned on, disconnect the load from the first battery bank when the third switching element is turned off, and disconnect the load from the second battery bank when the fourth switching element is turned off.

EXAMPLE 8

The circuit of examples 1-7 or any combination thereof, where the first switching element, the second switching element, the third switching element, and the fourth switching element each include a metal-oxide-semiconductor field-effect transistor (MOSFET), a bipolar junction transistor (BJT), an insulated gate bipolar transistor (IGBT), or a junction field effect transistor (JFET).

EXAMPLE 9

The circuit of examples 1-8 or any combination thereof, where the circuit is configured to operate in the first switching mode during a plurality of primary phases, where each primary phase of the plurality of primary phases lasts for a first amount of time, operate in the second switching mode during a plurality of secondary phases, where each secondary phase of the plurality of secondary phases lasts for a second amount of time, and interleave the plurality of primary phases and the plurality of secondary phases such that a primary phase is followed by a secondary phase, and the secondary phase is followed by a consecutive primary phase.

EXAMPLE 10

The circuit of examples 1-9 or any combination thereof, where the circuit is further configured to change from operating in the first switching mode to operating in the second switching mode if a temperature of the first battery bank is greater than a temperature of the second battery bank by more than a temperature difference threshold, and change from operating in the second switching mode to operating in the first switching mode if the temperature of the second battery bank is greater than the temperature of the first battery bank by more than the temperature difference threshold.

EXAMPLE 11

The circuit of examples 1-10, where the circuit is further configured to change from operating in the first switching mode to operating in the second switching mode if a magnitude of a voltage of the first battery bank is less than a magnitude of a voltage of the second battery bank by more than a voltage difference threshold, and change from operating in the second switching mode to operating in the first switching mode if the magnitude of the voltage of the second battery bank is less than the magnitude of the voltage of the first battery bank by more than the voltage difference threshold.

EXAMPLE 12

A system includes a first battery bank including a first positive terminal and a first negative terminal and a second battery bank including a second positive terminal and a second negative terminal, where the second battery bank is connected in parallel with the first battery ban. Additionally, the system includes a circuit. The circuit includes a switching element including a source terminal and a drain terminal, where the switching element is connected in parallel with the first battery bank and the second battery bank, where the source terminal is electrically connected to the first negative terminal and the drain terminal is electrically connected to the first positive terminal, and where while the switching element is turned on, the first positive terminal and the second negative terminal are electrically connected via the switching element.

EXAMPLE 13

The system of example 12, where the circuit further includes a capacitor connected in parallel with the switching element.

EXAMPLE 14

The system of examples 12-13, or any combination thereof, where the circuit further includes a diode including a cathode and an anode, where the cathode is electrically coupled to the capacitor and the second positive terminal, and where the anode is electrically coupled to the first positive terminal.

EXAMPLE 15

The system of examples 12-14, or any combination thereof, where the switching element includes a first switching element, where the source terminal includes a first source terminal, and where the drain terminal includes a first drain terminal. The circuit further includes a second switching element including a second source terminal and a second drain terminal, the second switching element connected in parallel with the capacitor and the first switching element, where the second source terminal is electrically connected to the second negative terminal, where the second drain terminal is electrically connected to the second positive terminal, and where while the second switching element is turned on, the first positive terminal and the second negative terminal are electrically connected via the second switching element.

EXAMPLE 16

The system of examples 12-15, where the circuit further includes a third switching element, a fourth switching element, a first diode including a first cathode and a first anode, and a second diode including a second cathode and a second anode, where the third switching element is electrically connected to the first positive terminal of the first battery bank and the third switching element is electrically connected, via the second diode, to the second positive terminal of the second battery bank, where the fourth switching element is electrically connected to the second positive terminal and the fourth switching element is electrically connected, via the first diode, to the first positive terminal, where the first anode of the first diode is electrically connected to the first positive terminal and the first cathode is electrically connected to the capacitor, and where the second anode of the second diode is electrically connected to the second positive terminal and the second cathode is electrically connected to the capacitor.

EXAMPLE 17

The system of examples 12-16, where the circuit further includes a third switching element electrically connected to the first positive terminal of the first battery bank and a fourth switching element electrically connected to the second positive terminal of the second battery bank. Additionally, the system further includes a load electrically connected to the third switching element and the fourth switching element.

EXAMPLE 18

The system of examples 12-17, where the first switching element, the second switching element, the third switching element, and the fourth switching element each include a metal-oxide-semiconductor field-effect transistor (MOSFET), a bipolar junction transistor (BJT), an insulated gate bipolar transistor (IGBT), or a junction field effect transistor (JFET).

EXAMPLE 19

The system of examples 12-18, further including one or more sensors, where based on the one or more sensors, the circuit is configured to activate and deactivate the first switching element, the second switching element, the third switching element, and the fourth switching element.

EXAMPLE 20

A method includes drawing, using a switching element of a circuit, a current from a first battery bank when the switching element is turned on, where the current increases a temperature of the first battery bank, and delivering, using the circuit, at least some of an excess current to a second battery bank when the switching element is turned off, where the excess current is emitted by the first battery bank, where the excess current charges the second battery bank, and where the excess current increases a temperature of the second battery bank.

Various examples of the disclosure have been described. These and other examples are within the scope of the following claims.

What is claimed is:

1. A circuit comprising a first switching element, a second switching element, and a capacitor, wherein the circuit is configured to:
   draw, using the first switching element, a first current from a first battery bank when the first switching element is turned on, the first battery bank emitting a first excess current after the first switching element is turned off, wherein the first current increases a temperature of the first battery bank;
   deliver at least some of the first excess current to a second battery bank when the first switching element is turned off, wherein the first excess current charges the second battery bank, and wherein the first excess current increases a temperature of the second battery bank;
   charge, using the first excess current, the capacitor while the first switching element is turned off; and
   discharge the capacitor when the first switching element is turned on, the capacitor emitting a second current to the second battery bank, wherein the second current charges the second battery bank, and wherein the second current increases a temperature of the second battery bank;

draw, using the second switching element, a third current from the second battery bank when the second switching element is turned on, the second battery bank emitting a second excess current after the second switching element is turned off;

deliver at least some of the second excess current to the first battery bank when the second switching element is turned off;

charge, using the second excess current, the capacitor while the second switching element is turned off; and discharge the capacitor when the second switching element is turned on, the capacitor emitting a fourth current to the first battery bank, wherein the third current increases the temperature of the second battery bank, wherein the second excess current increases the temperature of the first battery bank, and wherein the fourth current increases the temperature of the first battery bank.

2. The circuit of claim 1, wherein the first current increases the temperature of the first battery bank by crossing a resistance of the first battery bank, and wherein the first excess current increases the temperature of the second battery bank by crossing a resistance of the second battery bank.

3. The circuit of claim 1, wherein the circuit is further configured to operate in a first switching mode and operate in a second switching mode, wherein to operate in the first switching mode, the circuit is configured to charge, using the first excess current and the second current, the second battery bank while the second switching element is turned off, and wherein to operate in the second switching mode, the circuit is configured to charge the first battery bank while the first switching element is turned off.

4. The circuit of claim 3, wherein the circuit further comprises a third switching element, a fourth switching element, a first diode, and a second diode, and wherein to operate in the first switching mode, the circuit is further configured to:

deliver, while the third switching element is turned off and the fourth switching element is turned on, the at least some of the first excess current to the second battery bank via the first diode, wherein to operate in the second switching mode, the circuit is further configured to:

deliver, while the third switching element is turned on and the fourth switching element is turned off, the at least some of the second excess current to the first battery bank via the second diode.

5. The circuit of claim 3, wherein the circuit is configured to:

operate in the first switching mode during a plurality of primary phases, wherein each primary phase of the plurality of primary phases lasts for a first amount of time;

operate in the second switching mode during a plurality of secondary phases, wherein each secondary phase of the plurality of secondary phases lasts for a second amount of time; and interleave the plurality of primary phases and the plurality of secondary phases such that a primary phase is followed by a secondary phase, and the secondary phase is followed by a consecutive primary phase.

6. The circuit of claim 3, wherein the circuit is further configured to:

change from operating in the first switching mode to operating in the second switching mode if a temperature of the first battery bank is greater than a temperature of the second battery bank by more than a temperature difference threshold; and change from operating in the second switching mode to operating in the first switching mode if the temperature of the second battery bank is greater than the temperature of the first battery bank by more than the temperature difference threshold.

7. The circuit of claim 3, wherein the circuit is further configured to:

change from operating in the first switching mode to operating in the second switching mode if a magnitude of a voltage of the first battery bank is less than a magnitude of a voltage of the second battery bank by more than a voltage difference threshold; and change from operating in the second switching mode to operating in the first switching mode if the magnitude of the voltage of the second battery bank is less than the magnitude of the voltage of the first battery bank by more than the voltage difference threshold.

8. The circuit of claim 1, wherein the circuit further comprises a third switching element and a fourth switching element, and wherein the circuit is further configured to:

connect a load to the first battery bank and the second battery bank when the third switching element is turned on and the fourth switching element is turned on;

disconnect the load from the first battery bank when the third switching element is turned off; and disconnect the load from the second battery bank when the fourth switching element is turned off.

9. The circuit of claim 8, wherein the first switching element, the second switching element, the third switching element, and the fourth switching element each comprise a metal-oxide-semiconductor field-effect transistor (MOSFET), a bipolar junction transistor (BJT), an insulated gate bipolar transistor (IGBT), or a junction field effect transistor (JFET).

10. A system comprising:

a first battery bank comprising a first positive terminal and a first negative terminal;

a second battery bank comprising a second positive terminal and a second negative terminal, wherein the second battery bank is connected in parallel with the first battery bank; and a circuit comprising:

a first switching element comprising a first source terminal and a first drain terminal, wherein the first switching element is connected in parallel with the first battery bank and the second battery bank, wherein the first source terminal is electrically connected to the first negative terminal and the first drain terminal is electrically connected to the first positive terminal, and wherein while the first switching element is turned on, the first positive terminal and the second negative terminal are electrically connected via the first switching element;

a capacitor connected in parallel with the first switching element;

a second switching element comprising a second source terminal and a second drain terminal, the second switching element connected in parallel with the capacitor and the first switching element, wherein the second source terminal is electrically connected to the second negative terminal, wherein the second drain terminal is electrically connected to the second positive terminal, and wherein while the second switching element is turned on, the first positive terminal and the second negative terminal are electrically connected via the second switching element;

a third switching element electrically connected to the first positive terminal of the first battery bank; and a fourth switching element electrically connected to the second positive terminal of the second battery bank, wherein the system further comprises a load electrically connected to the third switching element and the fourth switching element.

11. The system of claim 10, wherein the circuit further comprises a diode comprising a cathode and an anode, wherein the cathode is electrically coupled to the capacitor and the second positive terminal, and wherein the anode is electrically coupled to the first positive terminal.

12. The system of claim 10, wherein the circuit further comprises:

a first diode comprising a first cathode and a first anode; and a second diode comprising a second cathode and a second anode, wherein the third switching element is electrically connected to the first positive terminal of the first battery bank and the third switching element is electrically connected, via the second diode, to the second positive terminal of the second battery bank, wherein the fourth switching element is electrically connected to the second positive terminal and the fourth switching element is electrically connected, via the first diode, to the first positive terminal, wherein the first anode of the first diode is electrically connected to the first positive terminal and the first cathode is electrically connected to the capacitor, and wherein the second anode of the second diode is electrically connected to the second positive terminal and the second cathode is electrically connected to the capacitor.

13. The system of claim 12, further comprising one or more sensors, wherein based on the one or more sensors, the circuit is configured to activate and deactivate the first switching element, the second switching element, the third switching element, and the fourth switching element.

14. The system of claim 10, wherein the first switching element, the second switching element, the third switching element, and the fourth switching element each comprise a metal-oxide-semiconductor field-effect transistor (MOSFET), a bipolar junction transistor (BJT), an insulated gate bipolar transistor (IGBT), or a junction field effect transistor (JFET).

15. A method comprising:

drawing, using a first switching element of a circuit, a first current from a first battery bank when the switching element is turned on, the first battery bank emitting a first excess current after the first switching element is turned off, wherein the first current increases a temperature of the first battery bank; and delivering, using the circuit, at least some of the first excess current to a second battery bank when the first switching element is turned off, wherein the first excess current charges the second battery bank, and wherein the first excess current increases a temperature of the second battery bank;

charging, using the first excess current, the capacitor while the first switching element is turned off; and discharging the capacitor when the first switching element is turned on, the capacitor emitting a second current to the second battery bank, wherein the second current charges the second battery bank, and wherein the second current increases a temperature of the second battery bank;

drawing, using the second switching element, a third current from the second battery bank when the second switching element is turned on, the second battery bank emitting a second excess current after the second switching element is turned off;

delivering at least some of the second excess current to the first battery bank when the second switching element is turned off;

charging, using the second excess current, the capacitor while the second switching element is turned off; and discharging the capacitor when the second switching element is turned on, the capacitor emitting a fourth current to the first battery bank, wherein the third current increases the temperature of the second battery bank, wherein the second excess current increases the temperature of the first battery bank, and wherein the fourth current increases the temperature of the first battery bank.

\* \* \* \* \*